United States Patent
Itsuji

(10) Patent No.: US 12,360,038 B2
(45) Date of Patent: Jul. 15, 2025

(54) TRANSMISSION APPARATUS, MEASUREMENT SYSTEM, AND CAMERA SYSTEM

(71) Applicant: CANON KABUSHIKI KAISHA, Tokyo (JP)

(72) Inventor: Takeaki Itsuji, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 419 days.

(21) Appl. No.: 17/933,708

(22) Filed: Sep. 20, 2022

(65) Prior Publication Data
US 2023/0101420 A1 Mar. 30, 2023

(30) Foreign Application Priority Data
Sep. 28, 2021 (JP) .................. 2021-157910

(51) Int. Cl.
| | | |
|---|---|---|
| *G01N 21/3581* | (2014.01) | |
| *G01N 21/84* | (2006.01) | |
| *G01N 21/88* | (2006.01) | |
| *H10F 39/00* | (2025.01) | |

(52) U.S. Cl.
CPC ..... *G01N 21/3581* (2013.01); *G01N 21/8422* (2013.01); *G01N 21/8806* (2013.01); *H10F 39/8023* (2025.01); *G01N 2021/8427* (2013.01)

(58) Field of Classification Search
CPC ........... G01N 21/3581; G01N 21/8422; G01N 21/8806; G01N 2021/8427; H10F 37/8023
See application file for complete search history.

(56) References Cited

U.S. PATENT DOCUMENTS

| | | |
|---|---|---|
| 9,766,330 B2 | 9/2017 | Nagaishi |
| 10,116,051 B2 | 10/2018 | Scarborough |
| 10,553,947 B2 | 2/2020 | Scarborough |
| 10,879,281 B2 | 12/2020 | Itsuji |
| 2015/0346334 A1 | 12/2015 | Nagaishi |
| 2018/0269576 A1 | 9/2018 | Scarborough |
| 2019/0074588 A1 | 3/2019 | Scarborough |
| 2019/0259791 A1 | 8/2019 | Itsuji |
| 2020/0144719 A1 | 5/2020 | Scarborough |
| 2021/0098513 A1 | 4/2021 | Itsuji |

FOREIGN PATENT DOCUMENTS

| | | |
|---|---|---|
| JP | 2007101189 A | 4/2007 |
| JP | 2009071437 A | 4/2009 |
| JP | 2014155134 A | 8/2014 |

(Continued)

*Primary Examiner* — Robert H Kim
*Assistant Examiner* — Hanway Chang
(74) *Attorney, Agent, or Firm* — Canon U.S.A., Inc. IP Division

(57) ABSTRACT

A transmission apparatus includes a plurality of transmission units each including a plurality of oscillation elements configured to oscillate terahertz waves and connection lines configured to connect the plurality of oscillation elements, and an optical unit disposed on the plurality of transmission units and including a plurality of optical elements, wherein each of the plurality of transmission units has a surface provided close to the optical unit and including an oscillation region where the plurality of oscillation elements is arranged, and wherein a distance between the surface and the optical unit is $2D^2/\lambda$, or larger, where $\lambda$ denotes a wavelength of the terahertz waves and D denotes a length of the oscillation region.

22 Claims, 13 Drawing Sheets

(56) References Cited

FOREIGN PATENT DOCUMENTS

| | | | |
|---|---|---|---|
| JP | 2017211293 | A | 11/2017 |
| JP | 2018087725 | A | 6/2018 |
| JP | 2018157541 | A | 10/2018 |
| JP | 2021063781 | A | 4/2021 |
| WO | 2018097035 | A1 | 5/2018 |

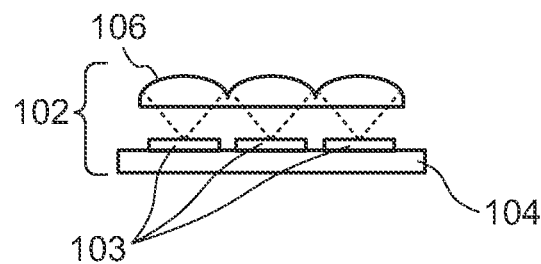
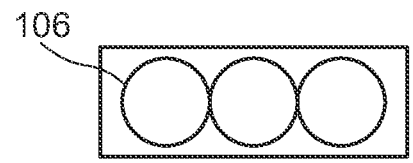
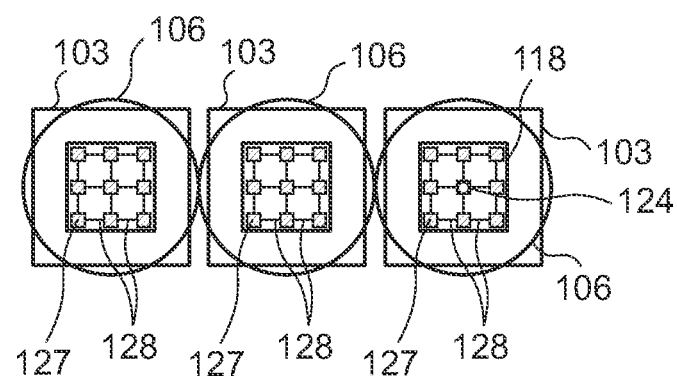
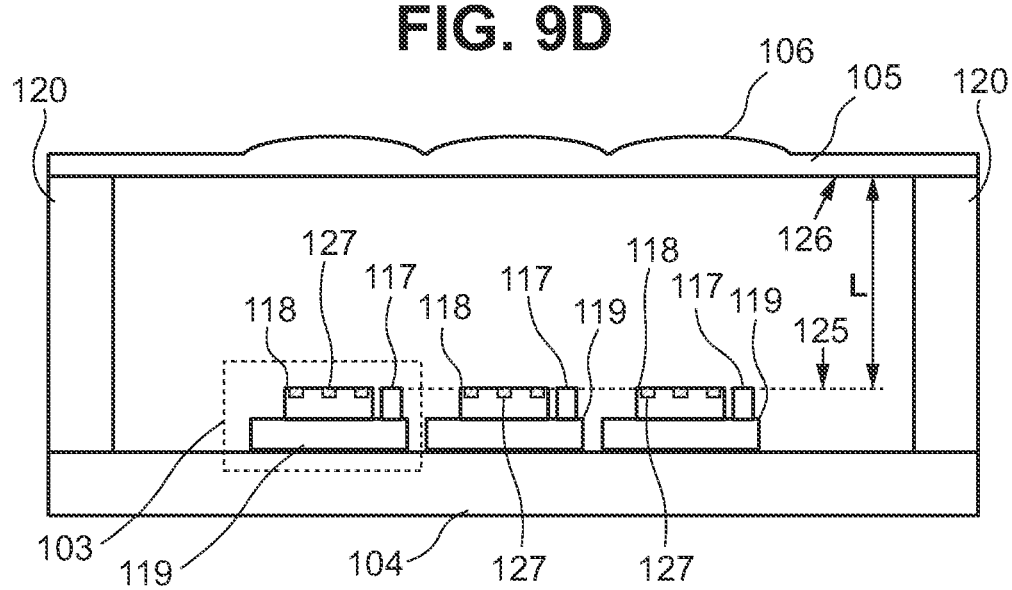

TRANSMISSION APPARATUS, MEASUREMENT SYSTEM, AND CAMERA SYSTEM

BACKGROUND

Field of the Disclosure

The present disclosure relates to a transmission apparatus, a measurement system, and a camera system.

Description of the Related Art

Japanese Patent Application Laid-Open No. 2018-087725 discusses a configuration related to a camera system using terahertz waves. The camera system discussed in Japanese Patent Application Laid-Open No. 2018-087725 includes a pair of an illumination unit having a plurality of terahertz generation elements and an illumination optical system provided in association with the illumination unit. Each of the terahertz waves generated by the terahertz generation elements focuses on a subject via the illumination optical system.

SUMMARY

According to an aspect of the present disclosure, a transmission apparatus includes a plurality of transmission units each including a plurality of oscillation elements configured to oscillate terahertz waves and connection lines configured to connect the plurality of oscillation elements, and an optical unit disposed on the plurality of transmission units and including a plurality of optical elements, wherein each of the plurality of transmission units has a surface provided close to the optical unit and including an oscillation region where the plurality of oscillation elements is arranged, and wherein a distance between the surface and the optical unit is $2D^2/\lambda$, or larger, where $\lambda$ denotes a wavelength of the terahertz waves and D denotes a length of the oscillation region.

According to another aspect of the present disclosure, a transmission apparatus includes a plurality of transmission units each including a plurality of oscillation elements configured to oscillate terahertz waves and connection lines configured to connect the plurality of oscillation elements, and an optical unit disposed on the plurality of transmission units and including a plurality of optical elements, wherein the optical unit is positioned in a far field of the terahertz waves.

Further features of various embodiments will become apparent from the following description of exemplary embodiments with reference to the attached drawings.

BRIEF DESCRIPTION OF THE DRAWINGS

FIGS. 9A to 9D are schematic views illustrating a configuration of a transmission apparatus according to the first exemplary embodiment.

DESCRIPTION OF THE EMBODIMENTS

A transmission apparatus using terahertz waves, a measurement system, and a camera system will be described in detail below with reference to the accompanying drawings. In the descriptions of each exemplary embodiment, redundant descriptions of components identical to those in other exemplary embodiments may be omitted. Each exemplary embodiment may be suitably changed or suitably combined with other exemplary embodiments.

In the following descriptions, a terahertz wave refers to an electromagnetic wave in a frequency domain of 10 GHz or more and 100 THz or less, more preferably 30 GHz or more and 30 THz or less.

Increasing the number of pairs of an illumination unit and an illumination optical system may enhance the output of terahertz waves. In a case where the number of pairs of an illumination unit and an illumination optical system increases, a plurality of light source patterns resulting from the illumination unit is formed on a subject. At this timing, a light source unevenness due to a plurality of light source patterns occurs. A light source unevenness refers to an intensity variation on an arbitrary surface, i.e., the surface of the subject. A terahertz wave is regularly reflected by many subjects because of a long wavelength. Accordingly, the camera system detects not only the image of the subject but also a light source unevenness formed on the subject. For this reason, it may be important to reduce the influence of the light source unevenness in many applications that use terahertz waves. Exemplary embodiments of the present disclosure will be described below.

A camera system according to a first exemplary embodiment will be described below with reference to FIGS. 1A, 1B, and 9A to 9D.

Figure 1A:
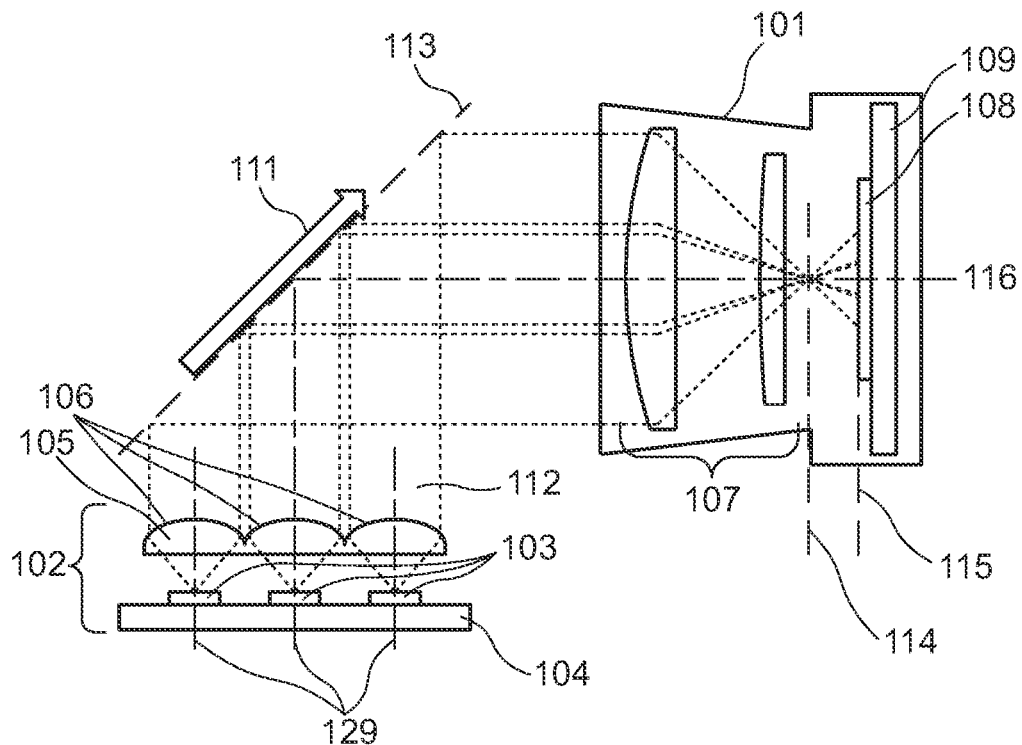
FIGS. 1A and 1B are schematic views illustrating a configuration of a camera system according to a first exemplary embodiment.
Figure 1B:
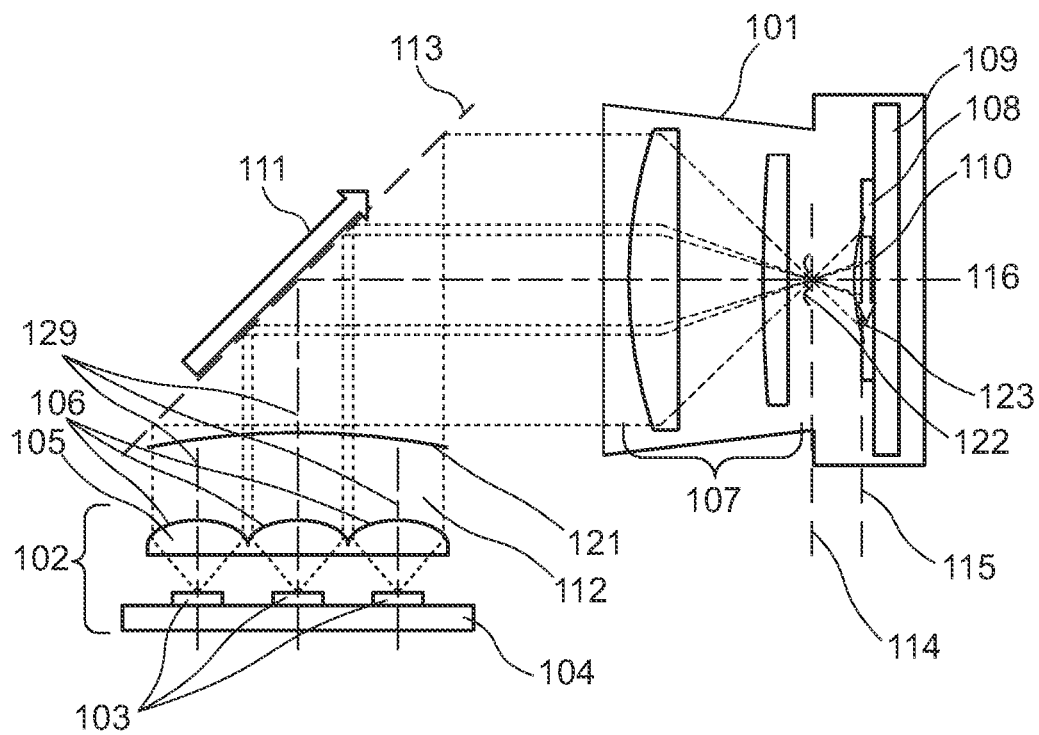

FIGS. 1A and 1B are schematic views illustrating a configuration of the camera system according to the first exemplary embodiment. FIG. 1A is a schematic view illustrating a system configuration, and FIG. 1B illustrates an irradiation pattern of terahertz waves 112 on the system configuration in FIG. 1A. A configuration of a terahertz camera system will be described below with reference to FIG. 1A.

The terahertz camera system includes a detection apparatus 101 as a terahertz camera, and a transmission apparatus 102. Terahertz waves 112 are emitted from the transmission apparatus 102 and radiated to a subject 111. The detection apparatus 101 detects the terahertz waves 112 from the subject 111. FIG. 1A illustrates the subject 111 as an arrow indicating an orientation for description. The subject 111 may be an arbitrary object. A surface 113 is the observation plane of the terahertz camera.

The transmission apparatus 102 includes a plurality of transmission units 103, a member 104, and an optical unit 105. Each of the plurality of transmission units 103 has a plurality of oscillation elements. The oscillation elements will be described in detail below with reference to FIGS. 9A to 9D. The transmission apparatus 102 includes the plurality of transmission units 103 each having the plurality of oscillation elements for oscillating terahertz waves 112, and the optical unit 105 provided on the plurality of transmission units 103.

The plurality of oscillation elements oscillates terahertz waves. Each oscillation element capable of oscillating a terahertz wave includes, for example, a negative resistive element and a resonator. For example, an oscillation element includes a Resonant Tunneling Diode (RTD) as a negative resistive element, and an antenna. The oscillation element is not limited thereto. A semiconductor having a gain for the terahertz wave to be used, such as a Gunn Diode and an IMPATT Diode, is can be used as the oscillation element. The configuration of the transmission unit 103 will be described in detail below. FIG. 1A schematically illustrates an arbitrary portion disposed in 1 row by 3 columns of the plurality of transmission units 103. The member 104 is also referred to as a circuit substrate. For example, a printed circuit board can be used as the member 104. A ceramic substrate or a silicon-based semiconductor substrate can be used as the member 104. The member 104 is provided with the plurality of transmission units 103 and may be provided with a circuit that operates the plurality of transmission units 103. The optical unit 105 includes at least one optical element, for example, a plurality of optical elements 106. The optical unit 105 has a portion covering the plurality of optical elements 106 and is configured so that the plurality of optical elements 106 is formed as a single unit, i.e., what is called, a lens plate. An optical element 106 is, for example, a lens. In this case, the optical element 106 is an upper convex lens array. The optical element 106 is preferably formed of a material transparent to a terahertz wave. Examples of materials transparent to a terahertz wave include high-density polyethylene (HDPE), high-resistance silicon, and Teflon® (Poly Tetra Fluoro Ethylene (PTFE)). A plurality of optical axes 129 indicates the optical axes of the plurality of optical elements 106. Each optical axis 129 may coincide with the center of the region where the transmission of a transmission unit 103 occurs in a planar view to the member 104. In a cross-sectional view, the upper surface of the transmission unit 103 may coincide with the front focal point of an optical element 106. The upper surface of the transmission unit 103 is also referred to as the surface on the optical unit side.

The detection apparatus 101 includes an optical unit 107, a detection unit 108, and a member 109. The optical unit 107 includes an optical element of an image forming optical system, e.g., a lens. The detection unit 108 includes a detection element capable of detecting a terahertz wave. The detection element capable of detecting a terahertz wave is an antenna formed of, for example, a rectifier element and a conductor. Examples of applicable rectifier elements include a Schottky barrier diode, and a rectifier diode such as a diode using a pn junction. The member 109 is also referred to as a circuit substrate. For example, a printed circuit board can be used as the member 109.

The member 109 is provided with a plurality of detection units 108 and may be provided with a circuit that operates the plurality of detection units 108. The plurality of detection units 108 is equivalent to each pixel in the terahertz camera. Not only a printed circuit board but also a ceramic substrate or a silicon-based semiconductor substrate can be used as the member 109. The optical unit 107 includes at least one optical element. The optical element is, for example, the lens of the image forming optical system. For example, the optical element can be formed of the above-described high-density polyethylene, high-resistance silicon, or Teflon®. An optical axis 116 indicates the optical axis of the optical element of the optical unit 107. The optical axis 116 may coincide with the center of the detectable region of the detection unit 108 in a planar view to the member 109.

The irradiation patterns will be described below with reference to FIG. 1B. In the camera system, the terahertz waves 112 are emitted via the optical unit 105. An irradiation pattern 121 is an example of an irradiation pattern at this time. The irradiation pattern 121 is a spatial intensity distribution of the terahertz waves 112. The terahertz waves 112 emitted from the plurality of transmission units 103 are combined into one irradiation pattern 121. The terahertz waves 112 are generated on the upper surfaces of the transmission units 103. In a case where the upper surfaces of the transmission units 103 are disposed close to the optical elements 106 with respect to the front focal points of the optical elements 106, each of the terahertz waves 112 generated by the optical elements 106 spreads and propagates as a spherical wave. At this time, in a case where the subject 111 and the detection apparatus 101 are sufficiently far from the optical unit 105, the radius of the spherical wave increases. For example, the terahertz waves 112 can be considered as plane waves in the vicinity of the optical axis 116. Accordingly, the irradiation pattern 121 can be considered to be a superimposed form of a plurality of plane waves generated by the plurality of transmission units 103, and can be approximated to a uniform line (plane) as illustrated in FIG. 1B. Since the irradiation pattern 121 can be considered as a superimposed form of a plurality of plane waves, this configuration enables restricting an intensity variation of the irradiation pattern 121 as a light source unevenness.

The above-described configuration utilizes, for imaging, some of the terahertz waves 112 in the vicinity of the optical axis 116 which can be considered as plane waves out of the terahertz waves 112 propagating as spherical waves. To improve the utilization efficiency of the generated terahertz waves 112, the upper surfaces of the transmission units 103 may be disposed on the front focal points of the optical elements 106. At this time, the terahertz waves 112 generated by the optical elements 106 propagate as plane waves 112 almost in parallel with the optical axis 129. The irradiation pattern 121 is an aggregate pattern including the plurality of terahertz waves 112 generated by the optical elements 106 and propagated as parallel light. Accordingly, the irradiation pattern 121 may be almost parallel to the transmission plane. In other words, the aggregate pattern includes neighboring terahertz waves 112 propagating as parallel light and as a whole provides an intensity distribution in line with the shape of the irradiation pattern 121.

According to the present disclosure, parallel light is the terahertz waves 112 having an intensity attenuated $1/e^2$ times the intensity of the optical axis 129 and propagating at a beam opening angle of 15 degrees or less. This results in a typical terahertz camera system (for example, the distance between the transmission apparatus 102 and the detection apparatus 101 is several meters, and the diameter of the optical unit 105 of the detection apparatus 101 is several tens to several hundreds of millimeters). Such a configuration enables capturing the majority of light of the generated terahertz waves 112 to the detection apparatus 101, facilitating the improvement of the signal-to-noise ratio (SNR) of the system. More preferably, terahertz waves 112 have the $1/e^2$ intensity and a beam opening angle of 2 degrees or less. In this case, it can be assumed that the transmission apparatus 102 is positioned almost in the infinity when viewed from the detection apparatus 101, and thus, the degree of freedom in distance setting between the transmission apparatus 102 and the detection apparatus 101 can be improved. Parallel light is defined as terahertz waves 112 having the $1/e^2$ intensity and a beam opening angle of $2*\text{Atan}(d/A)$ with an interval d between adjacent optical axes 129 and a distance A between the transmission apparatus 102 and the detection apparatus 101. In this case, the interference of terahertz waves 112 in the irradiation pattern 121 can be limited or simplified to adjacent terahertz waves 112 output from the optical unit 105. This makes it easier to predict and control the intensity distribution of the irradiation pattern 121, thus facilitating control of a light source unevenness. It is desirable that the diameter of the propagating optical elements 106 approximately coincides with the beam diameter (the diameter defined with the beam width for the $1/e^2$ intensity) of the terahertz waves 112 generated from the transmission units 103. It is desirable that the interval between adjacent optical axes 129 is arranged along the circumference of the beam diameter of the terahertz waves 112 generated from the transmission units 103. This arrangement enables closely arranging the transmission units 103 while restricting the interference between adjacent terahertz waves 112, thus facilitating the achievement of both the restriction of a light source unevenness and the improvement of terahertz wave signals.

The terahertz waves 112 are reflected by the subject 111 and then incident on the optical unit 107 of the detection apparatus 101. In a case where the irradiation pattern 121 of the terahertz waves 112 is parallel light, it can be assumed that the transmission apparatus 102 is arranged at infinity when viewed from the detection apparatus 101. At this time, the irradiation pattern 121 is formed as an irradiation pattern 122 on a rear focal plane 114 of the optical unit 107, and an irradiation pattern 123 is incident on an imaging plane 115 of the optical unit 107. The detection unit 108 is arranged on the imaging plane 115. The irradiation pattern 122 has an intensity pattern having the concavo-convex shape of the light source that follows the shape of the transmission unit 103. The irradiation pattern 123 is a defocused pattern having the concavo-convex shape of the light source that follows the shape of the transmission unit 103 on the imaging plane 115. In other words, referring to the light source pattern transferred to the irradiation pattern 122 as a secondary light source, the light source pattern spreading and propagating from the secondary light source is incident on the imaging plane 115 as the irradiation pattern 123. A subject image 110 is the image of the subject 111 formed on the imaging plane 115 by the optical unit 107. In this case, the transmission apparatus 102 having a uniform linear irradiation pattern is also referred to as a linear light source. In a case where the transmission unit 103 is disposed in the depth direction in FIG. 1B, a planar irradiation pattern results. The transmission apparatus 102 having a planar irradiation pattern is also referred to as, what is called, a planar light source. The irradiation pattern 123 is incident on the detection unit 108 in a defocused state. In other words, the intensity unevenness as an intensity pattern having a concavo-convex shape of the light source, following the shape of the transmission unit 103, is incident on the detection unit 108 in a defocused state. Because the intensity unevenness is defocused, intensity variations of the irradiation pattern can be reduced.

The transmission apparatus 102 will be described in detail below. FIGS. 9A to 9D are schematic views illustrating a configuration of the transmission apparatus 102 according to the present exemplary embodiment.

FIG. 9A is a cross-sectional view schematically illustrating the transmission apparatus 102, and FIG. 9B is a top view schematically illustrating the transmission apparatus 102. FIGS. 9A and 9B are associated with each other. The transmission units 103 are disposed in association with the optical elements 106 on a one-to-one basis. The optical unit 105 has a plurality of optical elements 106. The number of the plurality of transmission units 103 is equal to the number of the plurality of optical elements 106.

The optical elements 106 are upper convex lenses, and there is no gap between adjacent lenses.

Although each lens has a circular shape in a top view, the present invention is not limited to the circular shape. There may be a gap region between lenses, and each lens may have a rectangular, elliptical, or hexagonal shape.

FIG. 9C is a schematic view and a projection drawing illustrating the transmission apparatus 102. FIG. 9C is a projection drawing illustrating the main configurations when viewed from the top which is the direction from the member 104 to the optical elements 106 in FIG. 9A. FIG. 9C is also referred to as a more detailed version of FIG. 9B. According to the present exemplary embodiment, the plurality of transmission units 103 and the plurality of optical elements 106 are disposed at equal intervals. More specifically, the distance between the center of one transmission unit 103 and the center of another (adjacent) transmission unit 103 is almost the same as the distance between the center of one optical element 106 and the center of another (adjacent) optical element 106. In this case, the center of the transmission unit 103 and the center of the optical element 106 are positioned at a point 124. The two centers, however, do not need to coincide with each other. Although the plurality of optical elements 106 are disposed to be in contact with each other, the optical elements 106 may be disposed to be separated from each other. Although the plurality of transmission units 103 are disposed to be separated from each other, the transmission units 103 may be disposed to be in contact with each other. Referring to FIG. 9C, the boundaries of the optical elements 106 are positioned in spaces (what are called, gaps) between the transmission units 103. The optical elements 106 contains members 118 of the transmission units 103 in a planar view. With such a configuration, terahertz wave can be emitted without being leaked.

FIG. 9C illustrates a detailed configuration of the transmission units 103. Each of the transmission units 103 is provided with a plurality of (at least two) oscillation elements 127. In this case, the plurality of oscillation elements 127 is arranged in 3 rows by 3 columns. The plurality of oscillation elements 127 connected with each other via connection lines 128 can operate in synchronization between the phases of the oscillating terahertz waves 112. In more detail, adjusting the synchronized state of the phases enables utilizing the wave characteristics of radio waves to adjust the beam directivity (beam opening angle and front intensity) of the terahertz waves 112 generated from the transmission units 103. According to our study, a single oscillation element 127 isotropically emits a terahertz wave, and therefore the beam opening angle with the $1/e^2$ intensity is, for example, approximately 100 degrees.

In contrast, several tens of oscillation elements 127 are synchronized with the connection lines 128, so that the beam opening angle can be reduced to about ⅕. Because the beam opening angle is reduced in this way, the size of the optical elements 106 can be reduced while the shading of the terahertz waves 112 can be restricted in the vicinity of the boundaries between the optical elements 106. As a result, the mounting density of the transmission units 103 and the optical elements 106 can be increased to easily increase the power density of the terahertz waves 112. This point is different from the form of mounting array lenses on Light Emitting Diodes (LEDs). It is difficult to operate a plurality of LEDs in synchronization to adjust the beam directivity. Even in a case where a plurality of LEDs is arranged, the beam opening angle becomes approximately 100 degrees, resulting in an increase in the lens diameter of the array lenses. For this reason, it is difficult to achieve both the improvement of the power density and the downsizing of the apparatus. As a means for improving the power density of LEDs, a form of arranging a lens array that uses micro lenses to converge the beam is assumed. This form, however, requires a step of manufacturing micro lenses. In other words, the transmission units 103 of the present disclosure implement the function of converging the beam with micro lenses by synchronizing a plurality of oscillation elements 127, resulting in a simplified apparatus configuration in comparison with a LED apparatus. The region where the plurality of oscillation elements 127 is arranged is also referred to as an oscillation region. It is desirable that the center or the center of gravity of the oscillation region is positioned at the point 124. It is also desirable to arrange the oscillation elements 127 so that the center of the oscillation region coincides with the optical axis of the optical element 106. The number of the oscillation elements 127 included in each transmission unit 103 is not limited to the number illustrated in FIG. 9C. The upper surface of the transmission unit 103 may be the upper surface of the oscillation region.

The oscillation elements 127 can also be arranged so that one oscillation element 127 is positioned at the center of the oscillation region. The oscillation elements 127 can also be arranged so that the center of the resonator of the oscillation element 127 coincides with the center of the oscillation region.

FIG. 9D is a schematic view illustrating a cross-section of the transmission apparatus 102 according to the present exemplary embodiment. The configuration of the transmission apparatus 102 is not limited the example in FIG. 9D. FIG. 9D is also referred to as a more detailed version of FIG. 9A. In the transmission apparatus 102, the plurality of transmission units 103 is disposed, and the support members 120 are disposed on the member 104. The optical unit 105 is connected with the member 104 via the support members 120. The connection between the optical unit 105 and the support members 120 may be made by using a resin such as an adhesive or using other materials. The optical unit 105 may be fixed to the support members 120. As described above, the plurality of transmission units 103 is disposed on the member 104. A transmission unit 103 includes the member 118 provided with the plurality of oscillation elements 127, and a member 117 provided with a circuit that operates the plurality of oscillation elements 127. The transmission unit 103 also includes a member 119 provided with the members 118 and 117. In this case, the term "member" means a semiconductor substrate or a circuit substrate. On the member 119 of the transmission unit 103, a member having a function different from the functions of the members 118 and 117 may be disposed.

The position of the optical unit 105 will be described below with reference to FIG. 9D. It is desirable that the optical unit 105 is positioned in the "far field" with respect to the terahertz waves 112 generated by the transmission units 103. The transmission unit 103 has a plane 125. The plane 125 may be the upper surface of the oscillation region or the upper surface of the member 118, i.e., the upper surface of the transmission unit 103. The optical unit 105 has a lower surface as a plane 126. For example, when the distance between the planes 125 and 126 is a length L, the oscillation region of the transmission unit 103 has a length D, and terahertz waves 112 have a wavelength λ, a condition $L \geq 2D^2/\lambda$ needs to be satisfied. In a case where the optical unit 105 is disposed in the "far field", the beam shape of the terahertz wave generated from the oscillation region can be controlled independently of the properties of the material of the optical unit 105. Like the beam forming with visible light, the terahertz waves 112 can be approximately adjusted to parallel light via the optical unit 105. Because the terahertz waves 112 from the transmission apparatus 102 become a kind of parallel light, the transmission apparatus 102 can be virtually disposed in the infinity when viewed from the detection apparatus 101. Accordingly, an intensity unevenness resulting from a light source is incident on the detection unit 108 in a defocused state, and thus, the intensity unevenness of the detected signal can be reduced.

In a case where the beam directivity of the terahertz waves 112 can be designed together with the members of the optical unit 105, the position of the optical unit 105 may be in the "near field". In this case, the length L is smaller than $2D^2/\lambda$. In this case, since the optical elements 106 of the optical unit 105 come close to the transmission units 103, the optical elements 106 can be further downsized. For this reason, the mounting density of the transmission units 103 can be also increased, and the power density can be increased.

For example, the plane 125 may be the upper surfaces of the constituent conductors of the antennas of the oscillation elements 127 included in the transmission units 103. Accordingly, in a case where the position of the optical unit 105 is determined, the distance from the upper surfaces of the constituent conductors of the antennas to the optical unit 105 can be used. Although the wavelength is used in a case where the position of the optical unit 105 is determined, emitted wavelengths generally have, for example, a variation of about ±1% with respect to a desired wavelength. The position of the optical unit 105 can be determined with a margin corresponding to the variation.

The intensity distribution transmitted from the transmission unit 103 having the plurality of oscillation elements 127 indicates the shape of the oscillation region (a rectangular shape in FIG. 9C). Because the plurality of transmission units 103 is disposed, the intensity distribution of the transmission units 103 has the shape of an aggregate of a plurality of oscillation regions. In a case where the detection apparatus 101 acquires light of all terahertz waves 112, the irradiation pattern 122 provides an intensity distribution in line with the shape of the oscillation regions. However, in a case where the light is partly shaded, the shape of the oscillation regions cannot be reproduced, and as a result, what is called an aggregate of Gaussian distributions is provided. With such a configuration, the transmission apparatus 102 having a higher intensity can be provided. Further, because such a transmission apparatus 102 includes the optical unit 105, the above-described desired waveform can be easily provided.

According to the configuration of the present exemplary embodiment, an optical unit that is suitable for a transmission apparatus using terahertz waves can be provided.

A camera system according to a second exemplary embodiment will be described below with reference to FIGS. 2, 3, and 4.

Figure 2:
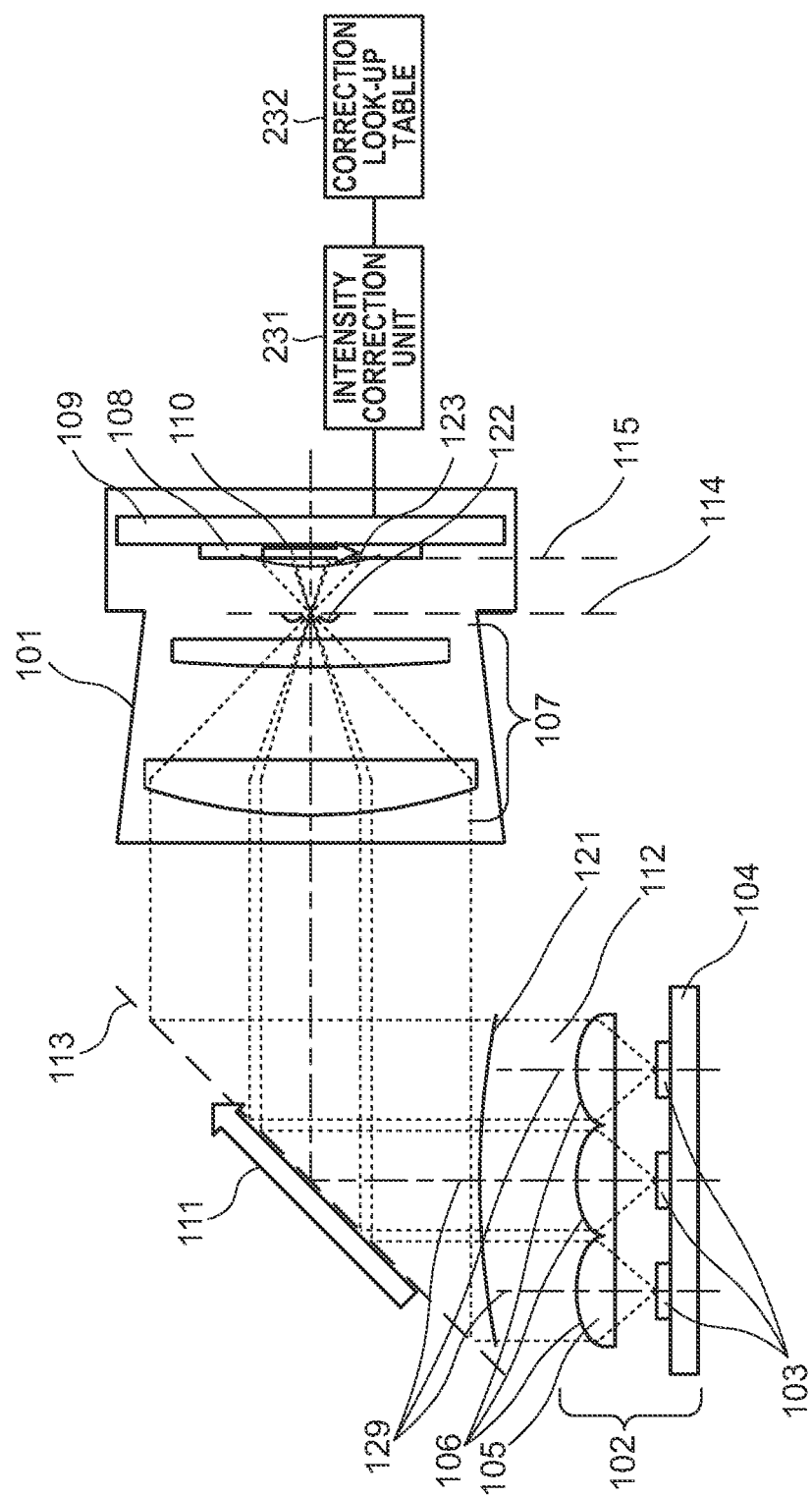
FIG. 2 is a schematic view illustrating a configuration of a camera system according to a second exemplary embodiment.

FIG. 2 is a schematic view illustrating a configuration of the camera system according to the second exemplary embodiment. FIG. 2 is a schematic view corresponding to FIG. 1B. In the present exemplary embodiment, the same reference numerals are assigned to components identical to those in the first exemplary embodiment, and redundant descriptions thereof will be omitted. Referring to FIG. 2, the camera system includes an intensity correction unit 231 and a correction look-up table 232 in addition to the components of the first exemplary embodiment.

The intensity correction unit 231 includes, for example, a calculation unit such as a Personal Computer (PC), and a dedicated processing substrate with a Field Programmable Gate Array (FPGA). The intensity correction unit 231 is also an example of a processing unit.

The intensity correction unit 231 may be disposed inside or outside of the detection apparatus 101. The correction look-up table 232 includes, for example, a database and may be provided in a cloud. The correction look-up table 232 manages correction data and coefficients for correcting the terahertz image, such as the sensitivity, noise level, and reference signal intensity of the plurality of detection units 108 (each pixel of the terahertz camera) in association with pixels. Operations of such a camera system will be described below with reference to FIGS. 3 and 4.

Figure 3:
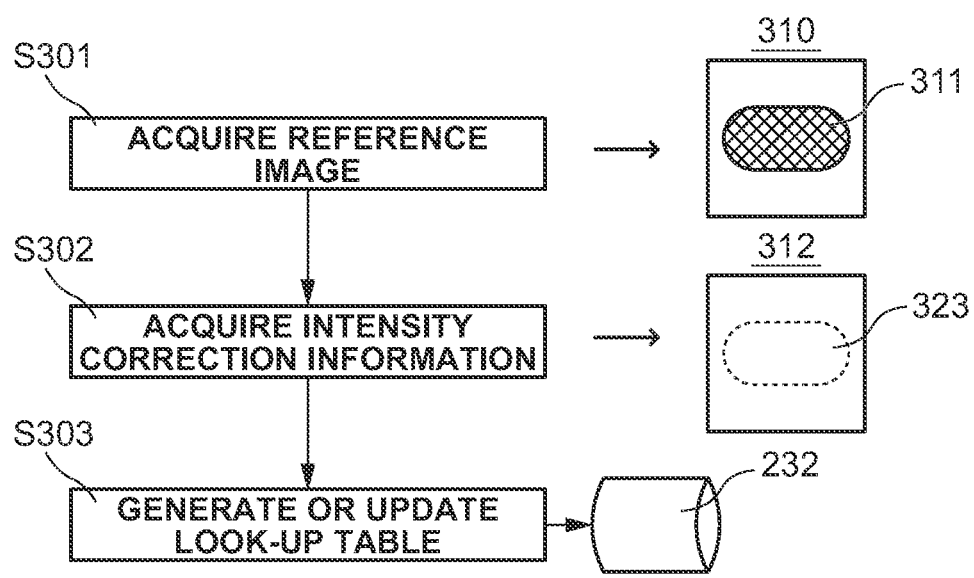
FIG. 3 is a flowchart illustrating an operation of the camera system according to the second exemplary embodiment.

FIG. 3 is a flowchart illustrating an operation of the camera system according to the present exemplary embodiment, i.e., a brief description of a flowchart for generating or updating information for image processing. The camera system can perform the following operations in steps S301 to S303.

Step S301 is a step of acquiring a reference image. In step S301, the camera system acquires a reference image. The reference image is an image acquired for a reference subject. The reference image is an image acquired by directly observing a reference terahertz light source. The image acquisition is also referred to as, for example, image information acquisition. The reference subject is a subject made of a known content and constituent material, for example, a subject having a uniform structure. The reference image includes an image of the terahertz wave transmitted from the transmission apparatus 102 and an image indicating the intensity distribution. Intensity distribution information can be acquired from the reference image. In step S301, the camera system acquires image information 310. The image information 310 includes information about an image 311 corresponding to the irradiation pattern 123 illustrated in FIG. 2.

Step S302 is a step of acquiring intensity correction information. In step S302, the camera system acquires terahertz wave intensity distribution information from the reference image. The camera system generates correction information by using the intensity distribution information.

The camera system generates intensity correction information 312 based on information about the image 311 included in the image information 310. For example, the intensity correction information 312 includes a correction pattern 323 corresponding to the irradiation pattern 123. The correction pattern 323 includes coefficients for intensity correction and image coordinate information.

Step S303 is a step of generating or updating the look-up table. In step S303, the camera system inputs the intensity correction information acquired in step S302 to the correction look-up table 232. Step S303 indicates a case of generating a new table and a case of updating the existing table.

In the above-described steps, information for the image processing is generated or updated. In camera system operations, the operations in steps S301 to S303 may be performed as operations during activation of the camera system. The operations in steps S301 to S303 may also be performed when an arbitrary period has elapsed since the camera system started operation, or at the time of shipment of the camera system. The operations in steps S301 to S303 can also be repetitively performed at arbitrary timings. For example, the camera system may operate the transmission apparatus 102 under arbitrary conditions, perform the operations in steps S301 to S303, operate the transmission apparatus 102 under other conditions, and then perform the operations in steps S301 to S303.

Figure 4:
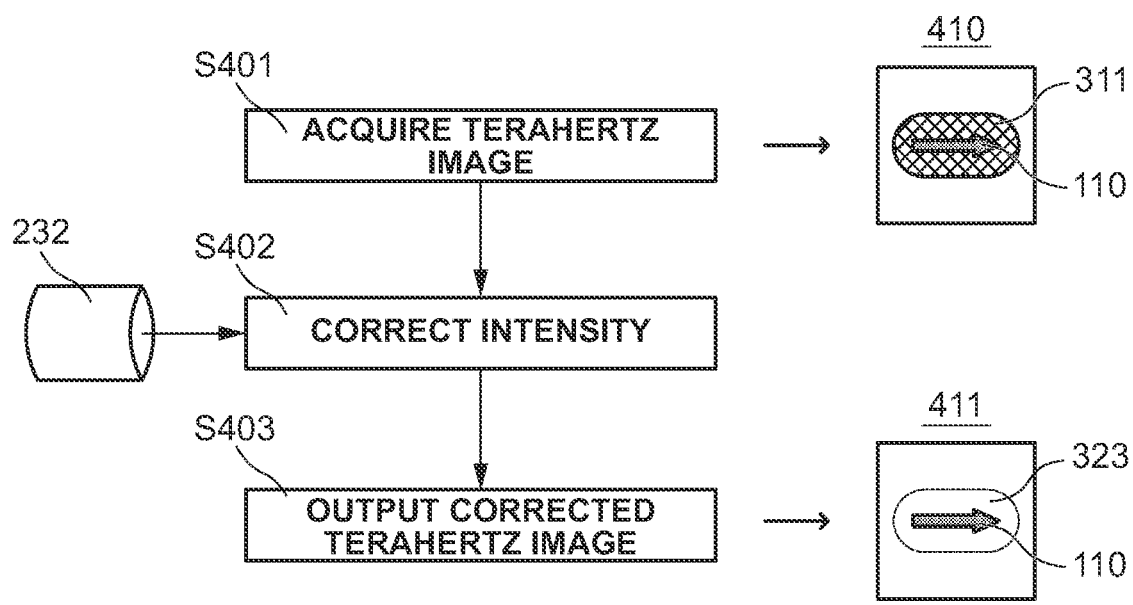
FIG. 4 is flowchart illustrating another operation of the camera system according to the second exemplary embodiment.

FIG. 4 is a flowchart illustrating an operation of the camera system according to the present exemplary embodiment, i.e., a brief description of a flowchart for performing the image processing. The camera system can perform the following operations in steps S401 to S403.

Step S401 is a step of acquiring a terahertz image, and is, what is called, an imaging step. A terahertz image is acquired when the terahertz waves 112 generated by the transmission apparatus 102 in FIG. 2 are reflected by the subject 111 and then detected by the detection apparatus 101. The acquired terahertz image is also referred to as image information 410. The image information 410 includes an image 311 including the irradiation pattern 123 illustrated in FIG. 3, and the subject image 110.

Step S402 is a step of correcting an intensity. In step S402, the camera system corrects the image information 410 by using the intensity correction information in the correction look-up table 232. The intensity correction information is, for example, the correction pattern 323 in FIG. 3. For example, the camera system performs processing for removing information about the correction pattern 323 from the image information 410. Examples of removal processing include differential processing.

Step S403 is a step of outputting a terahertz image. In step S403, the camera system outputs the corrected terahertz image. More specifically, in step S403, the camera system outputs image information 411 corrected in step S402. The portion of the correction pattern 323 is corrected in the image information 411, and the subject image 110 can be acquired.

The camera system according to the present exemplary embodiment can restrict light source unevenness information to a further extent than a terahertz image including the irradiation pattern 123 as a light source unevenness and the subject image 110. As a result, a more suitable terahertz image mainly including the subject image 110 can be acquired.

A camera system according to a third exemplary embodiment will be described below with reference to FIGS. 5 and 6.

Figure 5:
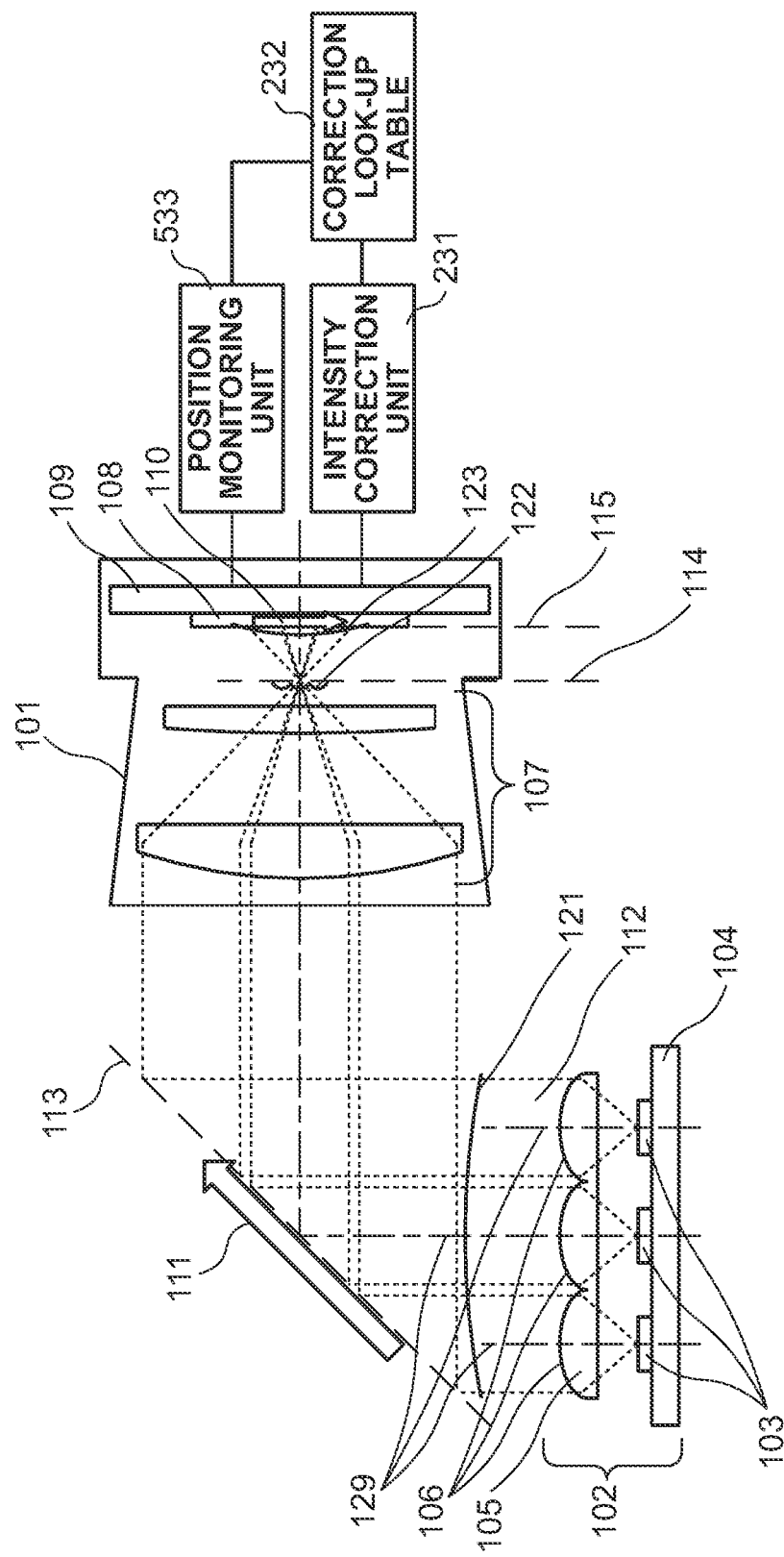
FIG. 5 is a schematic view illustrating a configuration of a camera system according to a third exemplary embodiment.

FIG. 5 is a schematic view illustrating a configuration of the camera system according to the third exemplary embodiment. FIG. 5 is a schematic view corresponding to FIG. 2. In the present exemplary embodiment, the same reference numerals are assigned to components identical to those in the second exemplary embodiment, and redundant descriptions thereof will be omitted. Referring to FIG. 5, the camera system includes a position monitoring unit 533 in addition to the components of the second exemplary embodiment. For example, the position monitoring unit 533 includes an image processing technique related to position detection and position monitoring performed by referring to the terahertz image output by the camera system. The position monitoring unit 533 needs to be able to detect at least a position. Operations of such a camera system will be described below with reference to FIG. 6. In the flowchart in FIG. 6, detailed descriptions of steps with similar names to those in the flowcharts in FIGS. 3 and 4 may be omitted.

Figure 6:
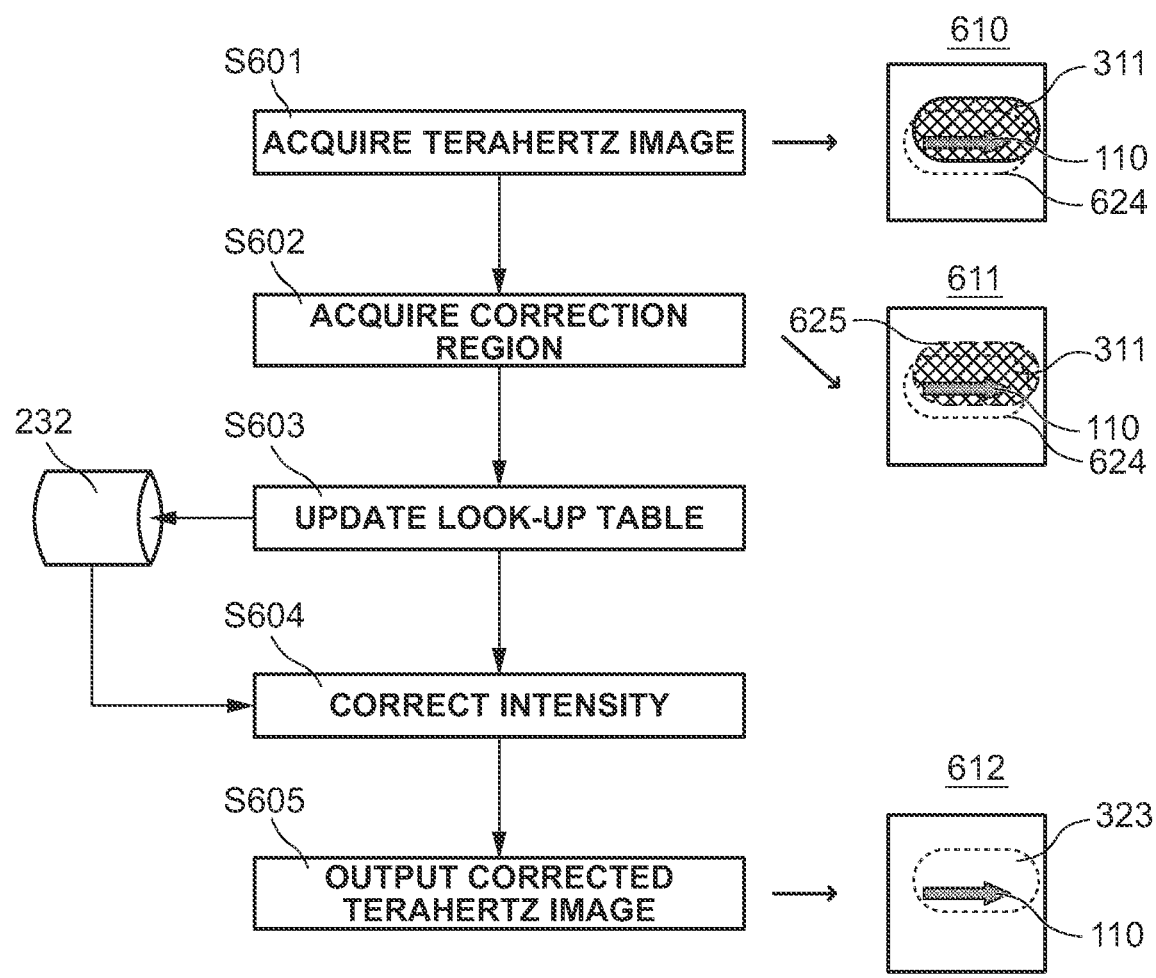
FIG. 6 is a flowchart illustrating an operation of the camera system according to the third exemplary embodiment.

FIG. 6 is a flowchart illustrating an operation of the camera system according to the present exemplary embodiment, i.e., a brief description of a flowchart for updating the information for the image processing. The camera system can perform the following operations in steps S601 to S605.

Step S601 is a step of acquiring a terahertz image, and is, what is called, an imaging step. A terahertz image is acquired when the terahertz waves 112 generated by the transmission apparatus 102 in FIG. 5 are reflected by the subject 111 and then detected by the detection apparatus 101. The acquired terahertz image is also referred to as image information 610. The image information 610 includes the image 311 including the irradiation pattern 123 illustrated in FIG. 3 and the subject image 110. The image information 610 indicates the correction region derived from the intensity correction information acquired in the flowchart in FIG. 3, as a correction region 624.

Step S602 is a step of acquiring a correction region. In step S602, the camera system acquires a correction region 625 from the image 311 in image information 611. Then, the camera system acquires positional information for the correction region 625 and acquires the amount of deviation from the position of the correction region 624.

Step S603 is a step of updating a look-up table. Based on the amount of deviation acquired in step S602, the camera system updates at least positional information in the intensity correction information in the correction look-up table 232. In a case where the amount of deviation is 0, the camera system does not need to update the positional information in the intensity correction information in the correction look-up table 232.

Step S604 is a step of correcting an intensity. The camera system corrects the image information 610 based on the intensity correction information in the updated correction look-up table 232. In this case, the intensity correction information is, for example, the correction pattern 323 in FIG. 3. Because the positional information has been updated, the region corresponding to the correction region 625 in the image information 611 corresponds to the position of the correction pattern 323.

Step S605 is a step of outputting a terahertz image. In step S605, the camera system outputs image information 612 corrected in step S604. The portion of the correction pattern 323 is corrected in the image information 612, and the subject image 110 can be acquired.

FIG. 5 illustrates a signal path that directly connects between the position monitoring unit 533 and the correction look-up table 232. The intensity correction unit 231 may be disposed on the signal path between the position monitoring unit 533 and the correction look-up table 232. The position monitoring unit 533 and the intensity correction unit 231 may be formed of the same processing chip or processing substrate.

According to the configuration of the present exemplary embodiment, a camera system can be provided that is capable of accurately correcting the deviation of the terahertz image even in a case where the terahertz image is deviated from an assumed correction region due to the change of the position and orientation of the subject 111.

A camera system according to a fourth exemplary embodiment will be described below with reference to FIGS. 7 and 8.

Figure 7:
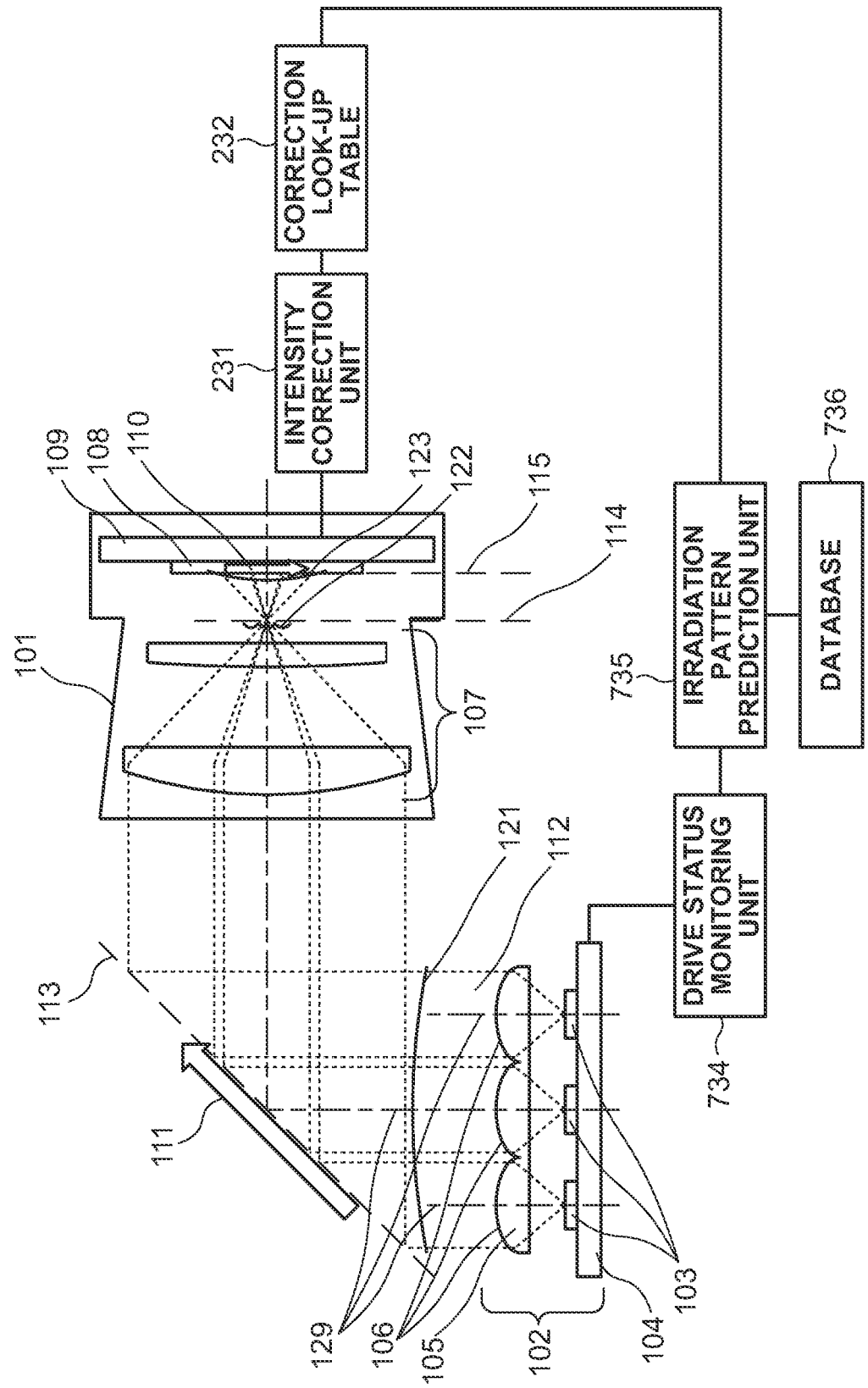
FIG. 7 is a schematic view illustrating a configuration of a camera system according to a fourth exemplary embodiment.

FIG. 7 is a schematic view illustrating a configuration of the camera system according to the fourth exemplary embodiment. FIG. 7 is a schematic view corresponding to FIG. 2. In the present exemplary embodiment, the same reference numerals are assigned to components identical to those in the second exemplary embodiment, and redundant descriptions thereof will be omitted. Referring to FIG. 7, the camera system includes an irradiation pattern prediction unit 735, a monitoring unit (more specifically, a drive status monitoring unit 734), and a database 736 in addition to the components of the second exemplary embodiment. The drive status monitoring unit 734 may include a sensor that measures drive statuses of the transmission apparatus 102 (including the drive frequency, drive bias, temperature in the apparatus, and ambient temperature). The database 736 may be formed of a storage device that stores changes of the beam shape and directivity of the terahertz wave output with respect to changes of the drive statuses. The irradiation pattern prediction unit 735 may include a calculation unit that refers to the drive statuses of the drive status monitoring unit 734 and information about the terahertz waves 112 in the database 736 to recalculate, for example, the intensity distribution and shape of the irradiation pattern 121. Operations of such a camera system will be described below with reference to FIG. 8. In the flowchart in FIG. 8, detailed descriptions of steps with similar names to those in the flowcharts in FIGS. 3 and 4 may be omitted.

Figure 8:
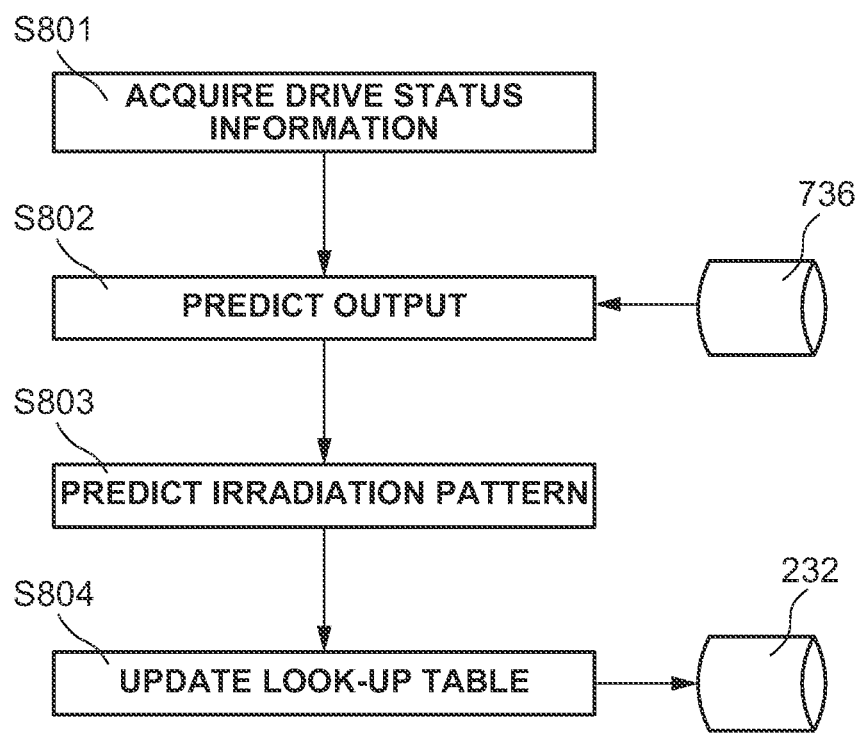
FIG. 8 is a flowchart illustrating an operation of the camera system according to the fourth exemplary embodiment.

FIG. 8 is a flowchart illustrating an operation of the camera system according to the present exemplary embodiment, i.e., a brief description of a flowchart for updating the information for the image processing. The camera system can perform the following operations in steps S801 to S804.

Step S801 is a step of acquiring drive status information. In step S801, the drive status monitoring unit 734 acquires drive status information about the transmission apparatus 102. The drive status information includes information that may change the output of the transmission apparatus 102, operating time, operating conditions, and operating temperature change.

Step S802 is a step of predicting an output. In step S802, the irradiation pattern prediction unit 735 refers to the drive status information to predict a change of the output of the transmission apparatus 102 and a change of the intensity distribution of the irradiation pattern 121. The irradiation pattern prediction unit 735 predicts changes of the output, beam shape, and directivity of the terahertz wave generated by the transmission unit 103 based on the operating status information acquired in step S801 and information about characteristic changes of the terahertz waves 112 corresponding to the drive status stored in the database 736. The database 736 may be stored in a storage unit.

Step S803 is a step of predicting an irradiation pattern. The irradiation pattern prediction unit 735 predicts the intensity distribution of the irradiation pattern as a light source unevenness based on information about the plurality of terahertz waves 112 acquired in step S802.

Step S804 is a step of updating the look-up table. The camera system updates the intensity correction information in the correction look-up table 232 based on the irradiation pattern acquired in step S804.

In a case where an output change is recognized when the output is predicted in step S802, it may also be desirable to perform the operation illustrated in FIG. 3.

FIG. 8 illustrates a signal path that directly connects the irradiation pattern prediction unit 735 and the correction look-up table 232. The intensity correction unit 231 may be disposed on the signal path between the irradiation pattern prediction unit 735 and the correction look-up table 232. The correction look-up table 232 and the database 726 may be stored in the same memory, and the irradiation pattern prediction unit 735 and the intensity correction unit 231 may be formed of the same processing chip or processing substrate.

With the configuration of the present exemplary embodiment, a camera system can be provided that is capable of performing correction to cope with a change of a light source unevenness accompanied by an apparatus status change during apparatus operation.

According to a fifth exemplary embodiment, modifications of the transmission apparatus 102 will be described below with reference to FIGS. 10A to 10H and 11A to 11E. FIGS. 10A to 10H and 11A to 11E are schematic views illustrating configurations of the transmission apparatus 102 according to the present exemplary embodiment. Referring to FIGS. 10A to 10H and 11A to 11E, the same reference numerals are assigned to components identical to those in other drawings, and redundant descriptions thereof will be omitted.

Figure 10A:
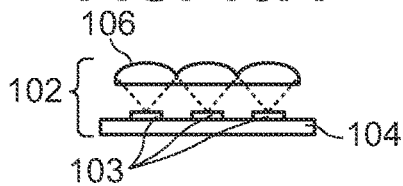
FIGS. 10A to 10I are schematic views illustrating configurations of a transmission apparatus according to a fifth exemplary embodiment.
Figure 10E:
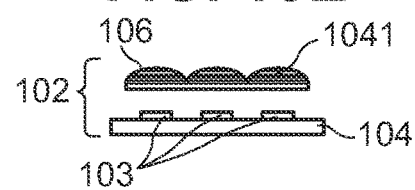
Figure 10B:
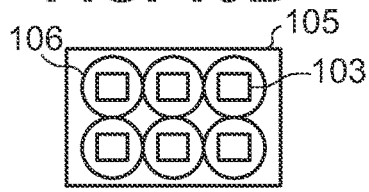

A modification illustrated FIGS. 10A and 10B will be described below. FIG. 10A is a schematic view illustrating a cross-section of the transmission apparatus 102. FIG. 10B is a schematic view illustrating the transmission apparatus 102 and corresponding to FIG. 10A. FIG. 10B is also referred to as a projection drawing. FIG. 10A corresponds to FIG. 9A, and FIG. 10B corresponds to FIG. 9B. The configuration of the present modification differs from the configuration in FIGS. 9A and 9B in that the transmission unit 103 and the corresponding optical elements 106 are disposed in 2 rows by 3 columns. The transmission unit 103 and the corresponding optical elements 106 can be two-dimensionally arranged.

With this configuration, terahertz waves 112 from the transmission apparatus 102 can function as a planar light source. An image of a terahertz wave is a regular reflection image. The number of beams from the transmission apparatus 102 to the subject 111 is equal to the number of beams from the subject 111 to the detection apparatus 101. Accordingly, the transmission apparatus 102 is used as a planar light source to increase the number of beams, so that the shape of the subject 111 can be easily grasped. According to the configuration of the present modification, the optical unit 105 includes a plurality of optical elements 106 like FIGS. 9A and 9B, and the number of the plurality of transmission units 103 is equal to the number of the plurality of optical elements 106.

Figure 10F:
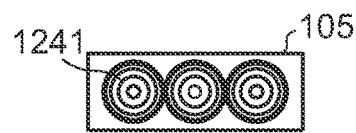
Figure 10C:
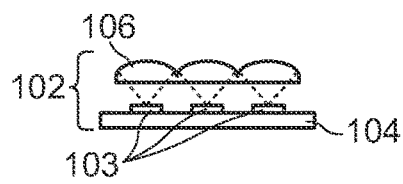
Figure 10G:
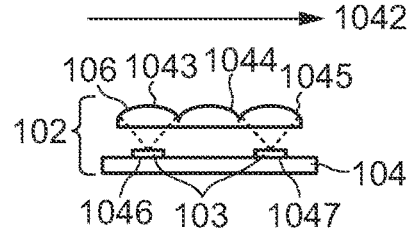
Figure 10D:
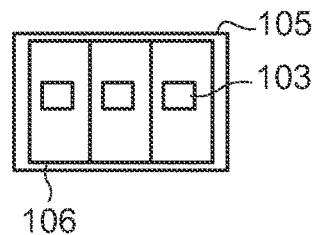

A modification illustrated in FIGS. 10C and 10D will be descried below. FIG. 10C is a schematic view illustrating a cross-section of the transmission apparatus 102. FIG. 10D is a schematic view illustrating the transmission apparatus 102 corresponding to FIG. 10C. FIG. 10D is also referred to as a projection drawing. The optical element 106 according to the present modification uses a hog-backed lens and a cylindrical lens. The use of such an optical element 106 facilitates the positioning between the optical element 106 and the transmission unit 103 in comparison with the upper convex lenses as illustrated in FIG. 10A. The cross-sectional shape of a cylindrical lens does not need to be an upper convex curve but may have a shape of a trapezoid or rectangle. The optical element 106 may be a lens having different curvatures in the vertical and horizontal directions in FIG. 10D. The curvatures in the vertical and horizontal directions are made different and the number of parameters for adjusting the beam shape is increased, so that the degree of freedom in beam adjustment improves, and thus, the beam shape can be easily adjusted to a desired irradiation pattern 121 even if the directivity of the terahertz wave emitted from the transmission unit 103 has the anisotropic characteristics.

A modification illustrated in FIGS. 10E and 10F will be described below. FIG. 10E is a schematic view illustrating a cross-section of the transmission apparatus 102. FIG. 10F is a schematic view illustrating the transmission apparatus 102 and corresponding to FIG. 10E. FIG. 10F is also referred to as a projection drawing. The optical element 106 according to the present modification uses an upper convex lens having a groove structure 1041. In this case, the groove structure 1041 is a concavo-convex structure. For example, the concavo-convex width and the difference of elevation of the concavo-convex structure are $\lambda/30$ or more and $\lambda/10$ or less, where $\lambda$ denotes the wavelength of the terahertz waves. For example, the width and the differences of elevation may be 5 μm or more and 25 μm or less, more preferably, 15 μm or more and 35 μm or less. Because a weak diffusion occurs to the terahertz wave in such a groove structure 1041, the intensity distribution inside the irradiation pattern 121 can be uniformed while the directivity and shape of the irradiation pattern 121 of the terahertz wave are maintained. The groove structure 1041 according to the present modification can be used for other optical elements.

Figure 10H:
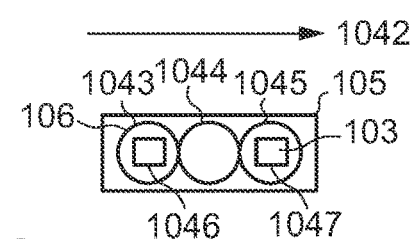

A modification illustrated in FIGS. 10G and 10H will be described below. FIG. 10G is a schematic view illustrating a cross-section of the transmission apparatus 102. FIG. 10H is a schematic view illustrating the transmission apparatus 102 and corresponding to FIG. 10G. FIG. 10H is also referred to as a projection drawing. According to the present exemplary embodiment, the number of the plurality of transmission units 103 is smaller than the number of the plurality of optical elements 106. In other words, as illustrated in FIG. 10H, two transmission units 103 and three optical elements 106 are disposed. More specifically, the three optical elements 106 are optical elements 1043, 1044, and 1045 disposed in this order along a first direction. The two transmission units 103 are transmission units 1046 and 1047 disposed in this order along the first direction. The optical element 1043 is positioned on the transmission unit 1046, and the optical element 1045 is positioned on the transmission unit 1047. The optical element 1044 is positioned on the boundary between the transmission units 1046 and 1047. Assume an example case where a part of the terahertz wave emitted from the transmission unit 1046 and to be input to the optical element 1043 is input to the optical element 1044 because of a positional deviation between the optical unit 105 and the transmission unit 1046. In this case, the state of the positional deviation can be confirmed by monitoring the terahertz wave output from the optical element 1044. More specifically, the positioning in a direction 1042 can be implemented by minimizing the intensity of the terahertz wave output by the optical element 1044. As illustrated in FIG. 10H, the positioning in the direction 1042 and the direction opposite to the direction 1042 can be implemented by disposing the transmission units 1046 and 1047 on both sides of the optical element 1044 and monitoring the intensity of the terahertz wave output by the optical element 1044. Such a configuration facilitates the positioning between the plurality of transmission units and the plurality of optical elements, for example, by monitoring the terahertz wave generated by the optical element 1044.

Figure 10I:
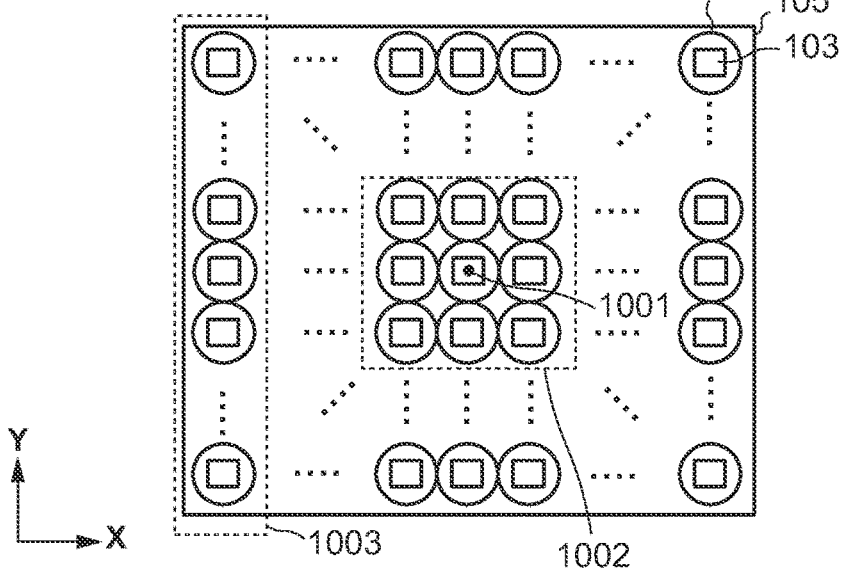

A modification illustrated in FIG. 10I will be described below. FIG. 10I is a schematic view illustrating the transmission apparatus 102. FIG. 10I is also referred to as a projection drawing. FIG. 10I illustrates a case where the number of arrays in FIG. 10B has been increased. According to the present modification, a plurality of transmission units 103 and a plurality of optical elements 106 are disposed on a one-to-one basis. Referring to FIG. 10I, in a plane including the X-direction and the Y-direction, the plurality of optical elements 106 is arranged in the X-direction and the Y-direction, and the plurality of transmission units 103 is arranged in the X-direction and the Y-direction. In this case, the plurality of optical elements 106 includes the optical elements 106 disposed in a region 1002 including a position 1001 as the center of the oscillation region, and the optical elements 106 disposed in a region 1003 disposed on the outer edge of the oscillation region. In this case, the optical elements 106 disposed in the region 1003 has different lens power from that of the optical elements 106 disposed in the region 1002. For example, the power of the optical elements 106 disposed in the region 1003 is made higher or lower than the power of the optical elements 106 disposed in the region 1002. With such a configuration, an intensity distribution of the terahertz waves 112 from the plurality of transmission units 103 disposed in an array form can be easily uniformed. According to the present modification, the number of transmission units 103 may be different from the number of optical elements 106. More specifically, the optical unit 105 includes the plurality of optical elements 106 disposed in an array form. Of the plurality of optical elements 106, the optical elements 106 disposed on the outer edge of the array and the optical elements 106 disposed inside the array are different in power. The power of the optical elements 106 can be suitably set in consideration of the output distribution of the plurality of transmission units 103. The power of the optical elements 106 can be changed by suitably setting the shape, material, and curvature of the optical elements 106.

In the configuration in FIG. 10I, instead of differentiating the power between the plurality of optical elements 106, the array interval of the plurality of optical elements 106 can also be differentiated between the regions 1002 and 1003. With such a configuration, an output distribution of the plurality of transmission units 103 can be uniformed. In this case, the array interval of the plurality of transmission units 103 may be different from or identical to the array interval of the plurality of optical elements 106. A configuration where the power is differentiated between the plurality of optical elements 106 may be combined. Suitable configurations may be selected from these configurations.

Figure 11A:
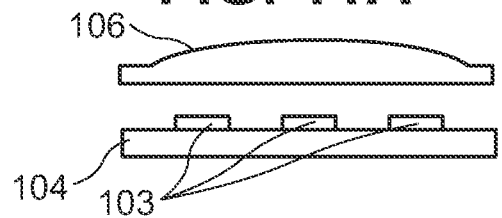
FIGS. 11A to 11E are schematic views illustrating other configurations of the transmission apparatus according to the fifth exemplary embodiment.
Figure 11B:
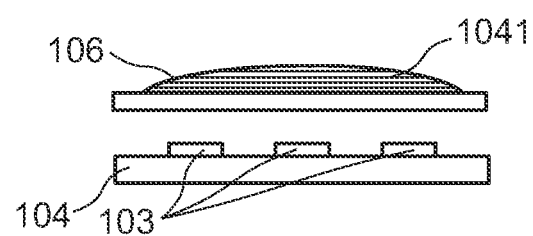
Figure 11C:
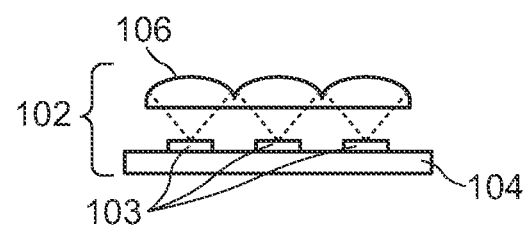
Figure 11D:
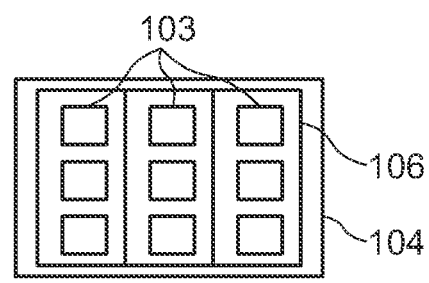
Figure 11E:
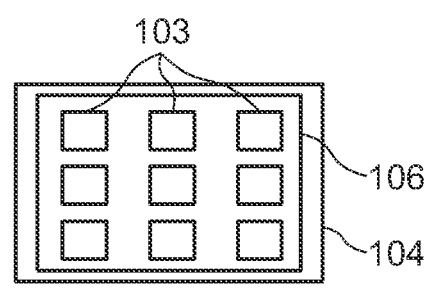

A modification illustrated in FIGS. 11A and 11B will be described below. FIG. 11A is a schematic view illustrating a cross-section of the transmission apparatus 102. Referring to FIG. 11A, a plurality of transmission units 103 is disposed on one optical element 106. FIG. 11B is a schematic view illustrating the transmission apparatus 102 and corresponding to FIG. 11A. FIG. 11B illustrates a configuration where a groove structure 1041 is provided on the optical element 106 in FIG. 11A. FIG. 11C is a schematic view illustrating a cross-section of the oscillation apparatus 102. FIG. 11D is a schematic view illustrating the upper surface of the oscillation apparatus 102, and is also referred to as a projection drawing. According to the present modification, the number of transmission units 103 for one optical element 106 is different from that in the modification in FIGS. 10C and 10D. The optical unit 105 includes a plurality of optical elements 106, and the number of the plurality of transmission units 103 is larger than the number of the plurality of optical elements 106. For example, the optical elements 106 are cylindrical lenses, and three transmission units 103 are provided for one optical element 106. With such a configuration, an intensity distribution of the terahertz waves 112 from the plurality of transmission units 103 can be uniform. FIG. 11E is a modification for FIG. 11D. Three optical elements 106 are provided in FIG. 11D while one optical element 106 is provided in FIG. 11E. As described above, preferable characteristics can be obtained by setting the number of optical elements 106 and the number of transmission units 103.

Figure 12:
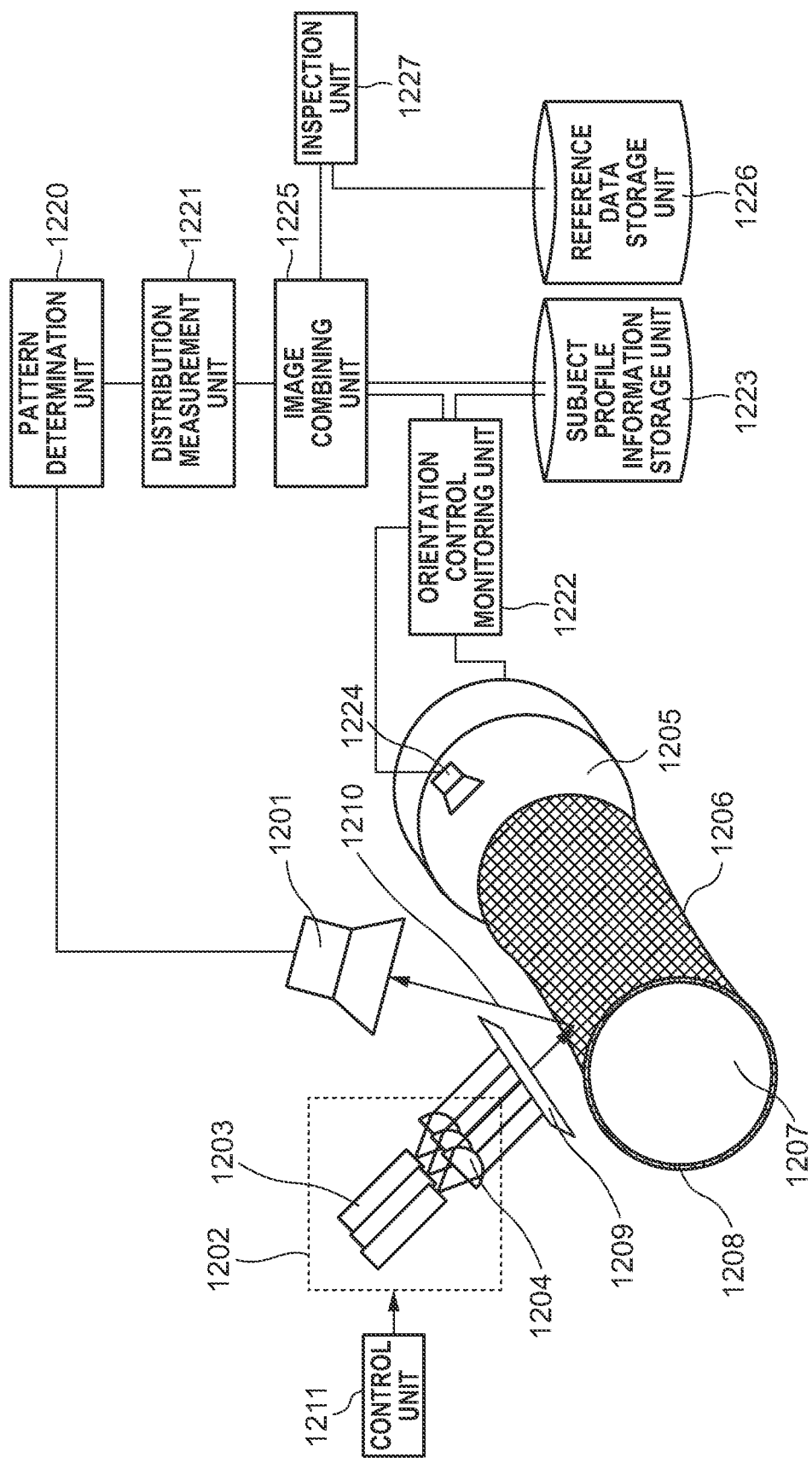
FIG. 12 is a schematic view illustrating a configuration of a measurement system according to a sixth exemplary embodiment.

A measurement system according to a sixth exemplary embodiment will be described below with reference to FIG. 12. FIG. 12 is a schematic view illustrating a configuration of the measurement system. Examples of subjects of the measurement system include a photosensitive drum with an amorphous silicon layer applied thereto, and a painted structure, such as a bridge formation.

The measurement system includes a measurement system 1201, a transmission apparatus 1202, and a support member 1205. The measurement system 1201 is, for example, a terahertz wave camera capable of detecting terahertz waves. The transmission apparatus 1202 includes, for example, a plurality of transmission units 1203, and a plurality of optical units 1204 disposed in association with the transmission units 1203. The support member 1205 is, for example, a stage that supports a subject 1206. The support member 1205 may include a moving unit for moving the subject 1206. For example, the subject 1206 includes a base material 1207 and a covering layer 1208. The transmission apparatus 1202 of the measurement system 1201 is controlled by a control unit 1211 and is capable of emitting terahertz waves having a specific irradiation pattern 1209. The measurement system 1201 detects a terahertz wave 1210 that is reflected by the subject 1206.

The measurement system may further include a pattern determination unit 1220, a distribution measurement unit 1221, a control unit 1222, a storage unit 1223, a monitoring unit 1224, an image combining unit 1225, a storage unit 1226, and an inspection unit 1227. The monitoring unit 1224 monitors the position and orientation of the subject 1206 corresponding to the status of the support member 1205. For example, the monitoring unit 1224 is a position detection apparatus, such as a visible camera or radar, and outputs orientation information about the subject 1206 in a measurement region detected by the measurement system 1201. The control unit 1222 controls the status of the support member 1205. The control unit 1222 refers to the orientation information about the subject 1206 output by the monitoring unit 1224 and outputs coordinate information about the measurement region on the subject 1206. The control unit 1222 may control the status of the support member 1205 based on the orientation information about the monitoring unit 1224. The pattern determination unit 1220 refers to image data output from the measurement system 1201 and extracts the position and region of the irradiation pattern 1209 emitted from the transmission apparatus 1202 included in the image data. The distribution measurement unit 1221 outputs the intensity distribution of pixels corresponding to the irradiation pattern 1209 extracted by the pattern determination unit 1220. At this time, the camera system performs image processing for restricting the above-described light source unevenness and outputs the intensity distribution image resulting from the properties and shape of the subject 1206 in the measurement region. For example, according to the present exemplary embodiment, the intensity distribution image resulting from the properties and shape of the subject 1206 is an image related to the film thickness distribution of the covering layer 1208 and the surface shape and flaws of the base material 1207 under the covering layer 1208. The intensity distribution image is not limited the above example. The image combining unit 1225 refers to the coordinate information about the measurement region and the intensity distribution image resulting from the properties of the shape of the subject 1206, and combines a wide range of the intensity distribution image in line with the shape of the subject 1206. At this time, the image combining unit 1225 may refer to spatial coordinate information related to the shape of the subject 1206 stored in the storage unit 1223, and combine the intensity distribution image. The storage unit 1223 is also referred to as a subject profile information storage unit. The inspection unit 1227 refers to a wide range of the intensity distribution image and inspects the shape and properties of the subject 1206. For example, the inspection unit 1227 refers to reference information for the shape and properties of the subject 1206 stored in the storage unit 1226 and performs pass-fail determination for the shape and properties. The storage unit 1226 is also referred to as a reference data storage unit. The film thickness of the covering layer 1208 can also be measured by using information from the surface of the base material 1207 and information from the surface of the covering layer 1208. In this case, the film thickness can be output, for example, through the calculation by the image combining unit 1225 based on the output from the measurement system 1201. The measurement system can also observe the surface of the base material 1207 of the subject 1206.

The measurement system may also include support members for the transmission apparatus 1202 and the measurement system 1201, and a moving unit for at least either one of the transmission apparatus 1202 and the measurement system 1201. More specifically, the measurement position of the subject 1206 can be changed by moving at least one of the subject 1206, the transmission apparatus 1202, and the measurement system 1201.

With the measurement system according to the present exemplary embodiment, the base material 1207 covered by the covering layer 1208 can be safely observed. The measurement system according to the present exemplary embodiment refers to the orientation of a subject, combines the intensity distribution images in line with the shape of the subject, and performs inspection. Accordingly, the measurement system can be easily applied to a subject having a free curved surface.

Figure 13:
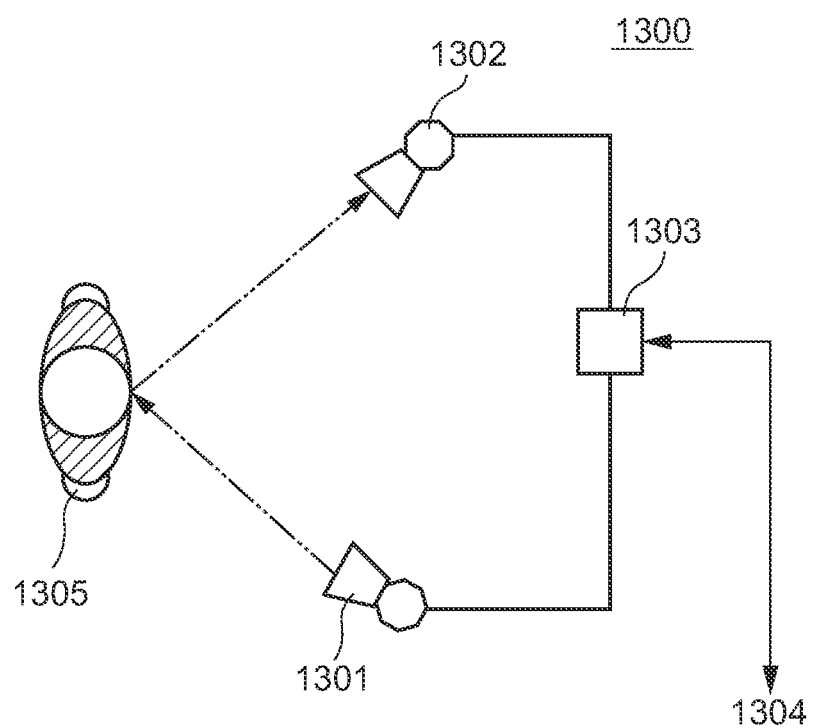
FIG. 13 is a schematic view illustrating a camera system according to a seventh exemplary embodiment.

A measurement system according to a seventh exemplary embodiment will be described below with reference to FIG. 13. FIG. 13 is a schematic view illustrating a configuration of a camera system 1300 using terahertz waves.

The camera system 1300 includes a transmission apparatus 1301, a detection apparatus 1302, and a processing unit 1303. Terahertz waves emitted from the transmission apparatus 1301 are reflected by a subject 1305 and then detected by the detection apparatus 1302. The processing unit 1303 processes signals detected by the detection apparatus 1302. Image data generated by the processing unit 1303 is output from an output unit 1304. With such a configuration, a terahertz image can be acquired.

For the optical unit 105 according to each exemplary embodiment, an arbitrary configuration, such as a Fresnel lens, a cylindrical lens, an elliptic lens, a convex lens, a concave lens, and a biconvex lens, can be selected. The optical unit 105 may be an optical element, such as a prism. The optical unit 105 may contain at least one of materials transparent to a terahertz wave, such as polyethylene, Teflon®, high-resistance silicon, and a polyolefin resin. Although the optical unit 105 is configured to include the plurality of optical elements 106 as a single structure, the optical unit 105 may include an independent optical element 106.

The optical unit 105 according to each exemplary embodiment may have an antireflection film or an antireflection structure for reducing the reflection of terahertz waves on at least either one of the upper and lower outer edges. The upper outer edge is also referred to as the outer edge on the emission side, and the lower outer edge is also referred to as the outer edge on the incident side.

The camera system may implement the image processing according to each exemplary embodiment based on Artificial Intelligent (AI) processing. The camera system can suitably change the processing form, for example, the camera system performs part of the AI processing for the image processing according to each exemplary embodiment by using a processing circuit, and performs the remaining AI processing by using a cloud.

According to the second exemplary embodiment, the camera system may control the operation of the transmission apparatus 102 based on the result of the intensity distribution measurement. The camera system may also individually control the operating conditions, such as the power of each of the transmission units 103 or each of the oscillation elements 127, so that a desired intensity distribution is obtained.

The camera systems according to the above-described exemplary embodiments are to be considered as just examples, and other exemplary embodiments are also applicable. In particular, information to be acquired by the system is not limited to image information. A detection system that performs signal detection is also applicable.

Each of the above-described exemplary embodiments is to be considered as just examples in embodying the present disclosure, and is not to be interpreted as restrictive on the technical scope of every embodiment. More specifically, the present disclosure may be embodied in diverse forms without departing from the technical concepts or essential characteristics thereof.

The present disclosure provides a preferable optical system in a transmission apparatus, a measurement system, and a camera system using terahertz waves.

While the present disclosure has described exemplary embodiments, it is to be understood that some embodiments are not limited to the disclosed exemplary embodiments. The scope of the following claims is to be accorded the broadest interpretation so as to encompass all such modifications and equivalent structures and functions.

This application claims priority to Japanese Patent Application No. 2021-157910, which was filed on Sep. 28, 2021 and which is hereby incorporated by reference herein in its entirety.

What is claimed is:

1. A transmission apparatus comprising:
   a plurality of transmission units each including a plurality of oscillation elements configured to oscillate terahertz waves, and connection lines configured to connect the plurality of oscillation elements; and
   an optical unit disposed on the plurality of transmission units and including a plurality of optical elements,
   wherein each of the plurality of transmission units has a surface provided close to the optical unit and includes an oscillation region where the plurality of oscillation elements is arranged, and
   wherein a distance between the surface and the optical unit is $2D^2/\lambda$ or larger, where $\lambda$ denotes a wavelength of the terahertz waves and D denotes a length of the oscillation region.

2. The transmission apparatus according to claim 1, wherein a space is disposed between the plurality of transmission units and the optical unit.

3. The transmission apparatus according to claim 1, wherein a number of the plurality of transmission units is larger than a number of the plurality of optical elements.

4. The transmission apparatus according to claim 1, wherein a number of the plurality of transmission units is smaller than a number of the plurality of optical elements.

5. The transmission apparatus according to claim 1,
   wherein the plurality of optical elements includes a first optical element, a second optical element, and a third optical element disposed in this order along a first direction,
   wherein the plurality of transmission units includes a first transmission unit and a second transmission unit disposed in this order along the first direction, and
   wherein the first optical element is positioned on the first transmission unit, the third optical element is positioned on the second transmission unit, and the second optical element is positioned on the region between the first and the second transmission units.

6. The transmission apparatus according to claim 1, wherein a number of the plurality of transmission units is equal to a number of the plurality of optical elements.

7. The transmission apparatus according to claim 1,
   wherein the plurality of optical elements is disposed in an array form, and
   wherein, out of the plurality of optical elements, power of the optical elements disposed on an outer edge of the array is different from power of the optical elements disposed inside the array.

8. The transmission apparatus according to claim 1,
   wherein each of the plurality of transmission units has a third member, and
   wherein the third member is provided with a first member where the plurality of oscillation elements is disposed and a second member where a circuit for operating the plurality of oscillation elements is disposed.

9. The transmission apparatus according to claim 1,
   wherein the transmission apparatus includes a fourth member,
   wherein the fourth member is provided with the plurality of transmission units and a support member, and
   wherein the optical unit is fixed to the support member.

10. The transmission apparatus according to claim 1, wherein the optical unit is at least one of a Fresnel lens, a cylindrical lens, an elliptic lens, a convex lens, and a concave lens.

11. The transmission apparatus according to claim 1, wherein the optical unit contains at least one of polyethylene, high-resistance silicon, Teflon®, and polyolefin.

12. The transmission apparatus according to claim 1,
    wherein the optical unit includes a surface having a concavo-convex structure, and
    wherein a height and a width of the concavo-convex structure are $\lambda/30$ or more and $\lambda/10$ or less, where $\lambda$ denotes the wavelength of the terahertz waves.

13. A measurement system comprising:
    the transmission apparatus according to claim 1;
    a detection apparatus configured to detect the terahertz waves emitted from the transmission apparatus;
    a support member configured to support a subject; and
    at least one of a first moving unit for moving the subject and a second moving unit for moving the transmission apparatus.

14. The measurement system according to claim 13,
    wherein the subject includes a first portion and a second portion for covering the first portion, and
    wherein the measurement system further comprises a processing unit configured to output a film thickness of the second portion based on an output from the detection apparatus.

15. A camera system comprising:
    the transmission apparatus according to claim 1;
    a detection apparatus configured to detect the terahertz waves emitted from the transmission apparatus; and
    a processing unit configured to process a signal from the detection apparatus.

16. A transmission apparatus comprising:
    a plurality of transmission units each including a plurality of oscillation elements configured to oscillate terahertz waves, and connection lines configured to connect the plurality of oscillation elements; and
    an optical unit disposed on the plurality of transmission units and including a plurality of optical elements,
    wherein each of the plurality of transmission units has a surface provided close to the optical unit and includes an oscillation region where the plurality of oscillation elements is arranged, and
    wherein the optical unit is positioned in a far field of the terahertz waves with reference to the surface.

17. The transmission apparatus according to claim 16, wherein a space is disposed between the plurality of transmission units and the optical unit.

18. The transmission apparatus according to claim 16,
    wherein each of the plurality of transmission units has a third member, and
    wherein the third member is provided with a first member where the plurality of oscillation elements is disposed, and a second member where a circuit for operating the plurality of oscillation elements is disposed.

19. The transmission apparatus according to claim 16,
    wherein the transmission apparatus includes a fourth member,
    wherein the fourth member is provided with the plurality of transmission units and a support member, and
    wherein the optical unit is fixed to the support member.

20. The transmission apparatus according to claim 16, wherein the optical unit contains at least one of polyethylene, high-resistance silicon, Teflon®, and polyolefin.

21. A measurement system comprising:
the transmission apparatus according to claim 16;
a detection apparatus configured to detect the terahertz waves emitted from the transmission apparatus;
a support member configured to support a subject; and
at least one of a first moving unit for moving the subject and a second moving unit for moving the transmission apparatus.

22. A camera system comprising:
the transmission apparatus according to claim 16;
a detection apparatus configured to detect the terahertz waves emitted from the transmission apparatus; and
a processing unit configured to process a signal from the detection apparatus.

* * * * *